(12) United States Patent
Ficorilli et al.

(10) Patent No.: US 6,828,673 B2
(45) Date of Patent: Dec. 7, 2004

(54) HEAT SINK ASSEMBLY

(76) Inventors: John Ficorilli, c/o T-Tech Machine Inc. 11 Knight St., Warwick, RI (US) 02886; Stephen Gruner, c/o T-Tech Machine Inc. 11 Knight St., Warwick, RI (US) 02886

(*) Notice: Subject to any disclaimer, the term of this patent is extended or adjusted under 35 U.S.C. 154(b) by 0 days.

(21) Appl. No.: 10/780,136

(22) Filed: Feb. 17, 2004

(65) Prior Publication Data

US 2004/0159936 A1 Aug. 19, 2004

Related U.S. Application Data

(60) Provisional application No. 60/447,985, filed on Feb. 18, 2003.

(51) Int. Cl.[7] .......................... H01L 23/10; H01L 23/34
(52) U.S. Cl. .................. 257/707; 257/706; 257/717
(58) Field of Search ................. 257/675, 706, 257/707, 712, 713, 717–720, 727; 438/117, 122, 123

(56) References Cited

U.S. PATENT DOCUMENTS

| 5,945,736 | A | * | 8/1999 | Rife et al. | .................. 257/719 |
| 6,075,699 | A | * | 6/2000 | Rife | .......................... 361/704 |
| 6,252,774 | B1 | * | 6/2001 | Rife | .......................... 361/704 |

* cited by examiner

Primary Examiner—Hung Vu
(74) Attorney, Agent, or Firm—Robert J. Doherty

(57) ABSTRACT

A heat sink assembly wherein the heat sink is allowed to move within vertical limits with respect to a clip adapted to hold both the heat sink and a microprocessor so as to accommodate heat expansion of the resultant assembly yet provide continual heat transfer contact between the heat sink and the microprocessor.

8 Claims, 5 Drawing Sheets

HEAT SINK ASSEMBLY

This application claims the benefit of U.S. Provisional Patent Application No. 60/447,985 filed Feb. 18, 2003.

BACKGROUND OF THE INVENTION

This invention applies primarily to solid-state electronic components and more specifically to attaching heat sinks to those components in order to control the damaging effects of heat generated by solid-state components during operation.

It is widely known that many solid-state electronic components, including microprocessors, generate excess heat during operation. That heat poses a serious threat to their performance and can result in the failure of such devices or neighboring components. As electronic devices inevitably become smaller, the cumulative effect of heat from neighboring components becomes a greater concern. In order to control the heat, devices such as cooling fans and heat sinks are commonly employed.

Attaching heat sinks to solid-state components has been achieved in a variety of ways with advantages and disadvantages to each method. Permanently adhering the heat sink to the electronic component generally ensures a good initial thermal interface, but with vibration and the passage of time, the bonds tend to deteriorate with degenerating effects on heat dissipation. Permanent bonding also precludes re-use and is impractical or impossible in many applications.

Using a secondary device, commonly known as a clip or adapter, is another popular way to attach heat sinks. Clips exist in a wide variety of designs ranging from single piece units to multiple part assemblies. They generally incorporate L-shaped legs to slide or slip over the electronic device package and then use a variety of methods to secure the heat sink. Clips can be cost effective ways to attach heat sinks to solid-state electronic components, but current designs have inherent problems.

One popular design as shown in U.S. Pat. No. 5,313,099 attaches the heat sink to the clip with a threaded coupling and uses the pressure of screwing down the heat sink against the electronic device package to secure and attach the heat sink to the clip assembly. The big advantage of this design is that this design provides initial adjustability for different thicknesses of electronic device packages. A thicker or thinner device package is accommodated by simply screwing the heat sink into the clip until the heat sink engages the solid-state component. However, this method requires substantial pressure between the contact surface of the heat sink and solid-state component to keep the heat sink from vibrating loose. The required pressure exceeds some solid-state electronic component manufacturer's specifications that can result in damage or destruction of the device. Even when all specifications are met, this method of attachment will still occasionally unscrew with potentially catastrophic consequences to thermal performance and neighboring components. Further, installation by this method requires torque sensitive tools, technicians trained in the proper use of those tools and the inherently time consuming process of properly aligning very finely threaded components. All these factors result in a costly installation process. Manufacturing and inspecting the very finely threaded heat sinks required in this design is also expensive. Finally, this design does not compensate for component expansion and contraction caused by the heat generated during operation. This expansion and contraction can cause the heat sink/clip assembly to unscrew or pop off the electronic device package with obviously damaging effects.

Another connection system proposed by U.S. Pat. No. 5,313,099 is to provide the attachment base of the heat sink with a tapered flange adapted to be forced through a bore in the clip until the radially extending lip of the flange snaps into a recessed area of the clip so as to secure and attach the sink to the clip. Although this snap fit attachment concept has not been commercialized, this concept would not provide for the effects of expansion and contraction of the heat sink clip assembly as with the threaded attachment base mode above discussed.

Accordingly, there is a need to provide a connection mechanism such that heat sinks of the aforementioned general type can be attached to the clips which in turn connect with and position the electronic device for effective heat transfer contact with the heat sink that compensates for component expansion and contraction.

Accordingly, the main object of the present invention is to provide an easy to install and inexpensive to manufacture heat sink and clip assembly which provides a secure reusable thermal coupling between a heat sink and a solid-state component for the purpose of dissipating heat and that will also compensate for expansion/contraction effects on thermal interfaces experienced during operation. The invention will achieve its purpose without exerting excessive force against solid-state components and will provide adjustability for varying thicknesses and pressure requirements of electronic device packages.

SUMMARY OF THE INVENTION

In a first embodiment of the invention, a heat sink is created with a base having a tapered initial lower surface and a contiguous upper and inversely tapered secondary or working surface. The two thus oppositely tapered surfaces of the heat sink base form a connecting flange or edge which connection defines the largest portion of the base. The heat sink is then inserted into an adaptor (clip) having an opening through which the heat sink base is inserted to form a working connection with the clip. The periphery of the clip opening is of the same shape and approximate size (e.g., diameter) as the heat sink base and is provided with a flexible radiused contact surface. The lower initial surface of the heat sink base by reason of its aforementioned taper presents a lesser dimension (diameter) such that as the heat sink is pushed into the clip the initial tapered base affords easier connectivity. Once the connection edge of the heat sink base is forced past the edges of the clip opening, operative connection between the heat sink and clip is achieved, and the flexible radius contact surfaces bear against the secondary working surface of the heat sink base.

The heat sink may be of radial fin, pin fin or other design as required by the application, and the clip's receiving opening will reflect the required heat sink's base whether the shape be square, round of other geometric shape. The clip may be attached to the electronic device package by opposing L-shaped legs protruding below the clip's heat sink receiving surface. The heat sink is then secured to both the clip and electronic device package by inserting the heat sink it through the clip's receiving opening where the beat sink is held in place by the force of the clip's flexible receiving collar exerting horizontal force against the heat sink's incline plane working surface which results in a downward vertical force component being exerted against the heat sink towards the solid-state component thermal interface surface and vertical force exerted against the clip's L-shaped legs to the under side of the electronic device package.

The amount of force required to secure the heat sink/clip assembly to an electronic device package is controlled for differing applications by changing the angle of the heat sink base's incline plane and/or changing the flexibility of the clip's receiving collar. The flexibility of the clip's receiving collar riding against the heat sink's incline plane allows the heat sink to travel vertically for a predetermined distance without significantly changing the pressures between the thermal interface surface, the clip's legs to the electronic device package or, finally, the heat sink to the clip. The properties of the clip's flexible retaining collar riding against the heat sink's incline plane also virtually eliminates the damaging effects of vibration and heat expansion/contraction to the thermal interface.

Numerous advantages to the invention's application, manufacturing and installation become self evident in the detailed description and drawings submitted herein.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

Turning now to the drawings, it will be evident that FIG. 1 thereof is a perspective view in broken apart assembly format showing a heat sink, a receiving clip of the present invention and a microprocessor having a pinned grid array.

DESCRIPTION OF THE INVENTION

Figure 1:
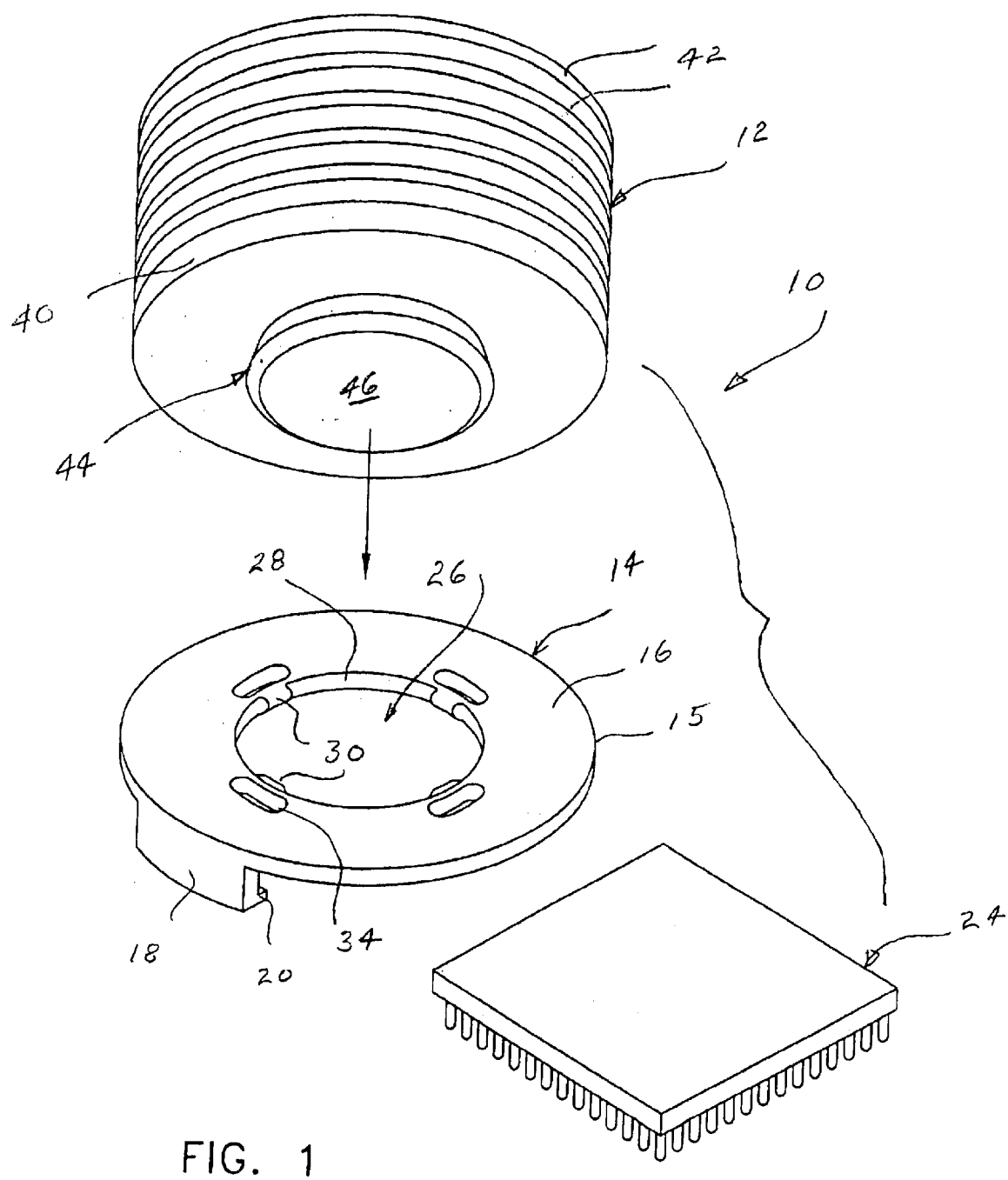
Figure 2:
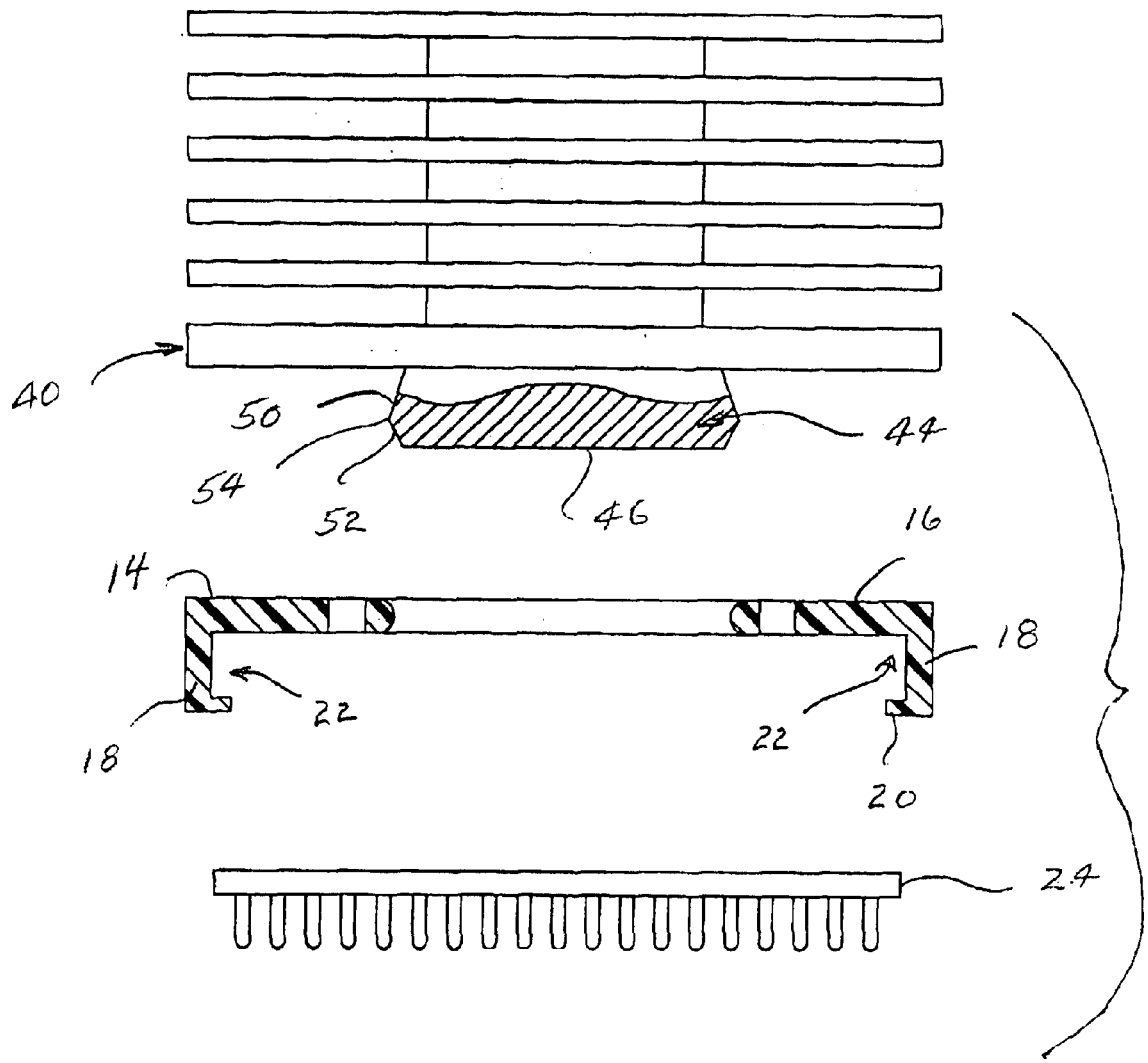
FIG. 2 is a side elevational view of FIG. 1 showing the same components in broken apart condition.
Figure 3:
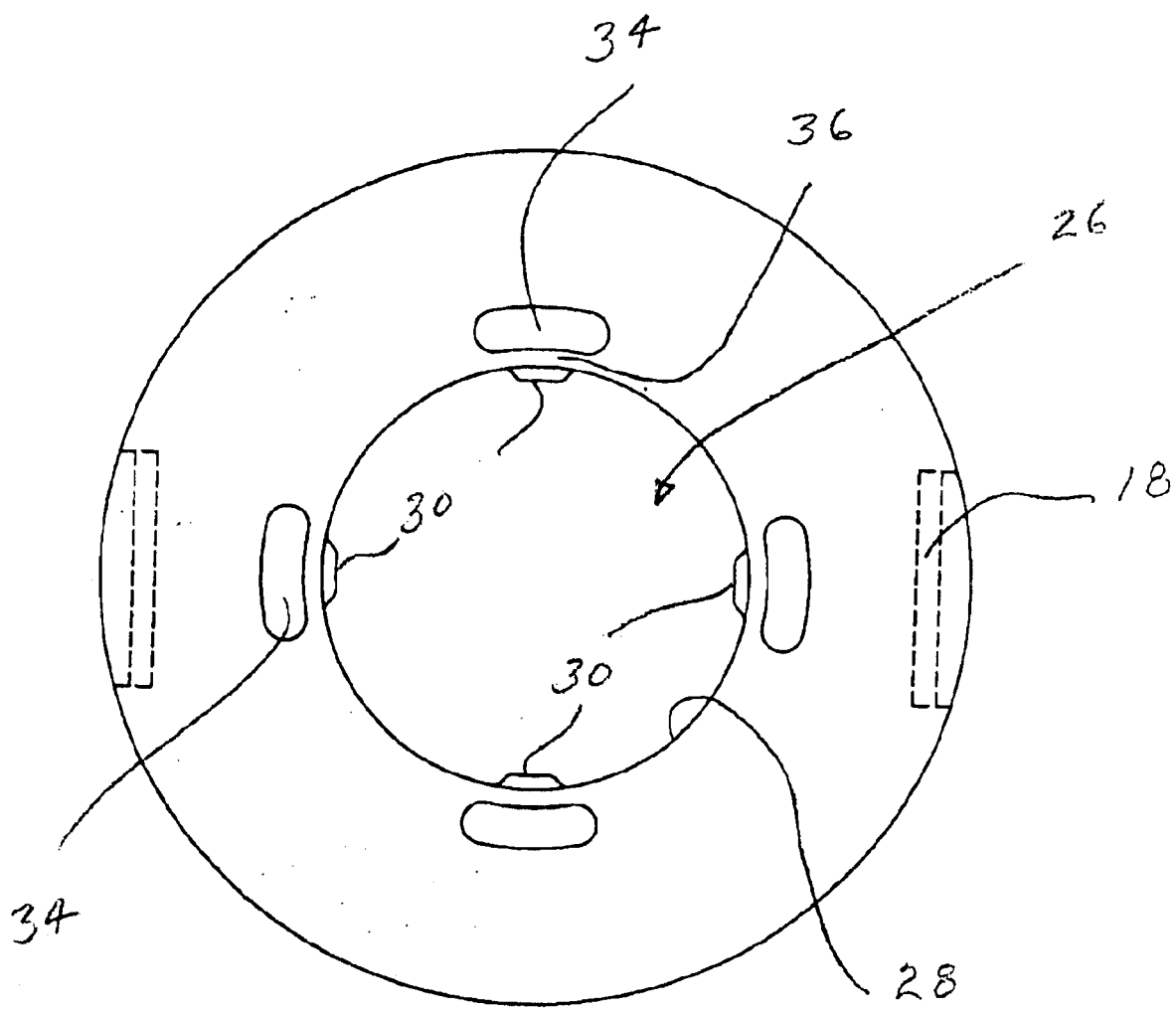
FIG. 3 is a top planar view of the clip of the present invention.
Figure 4:
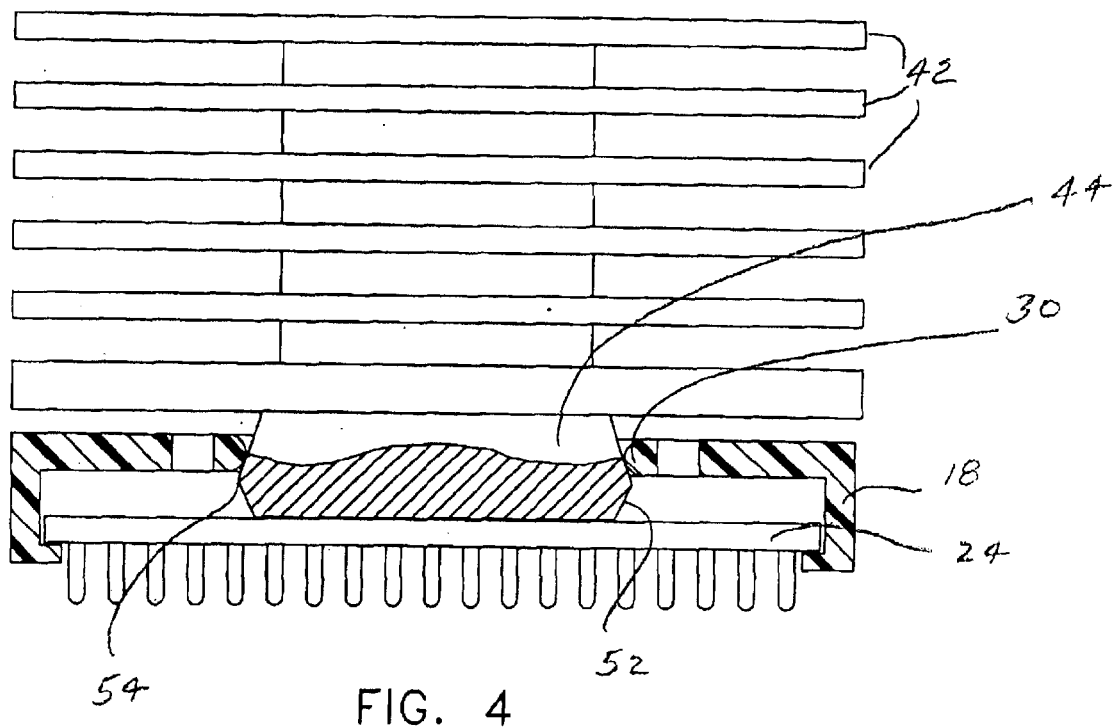
FIG. 4 is a partial sectional view showing the manner in which the heat sink clip and microprocessor are cooperatively attached to each other and how the bearing contact surfaces of the clip opening bear against the base of the heat sink.
Figure 4A:
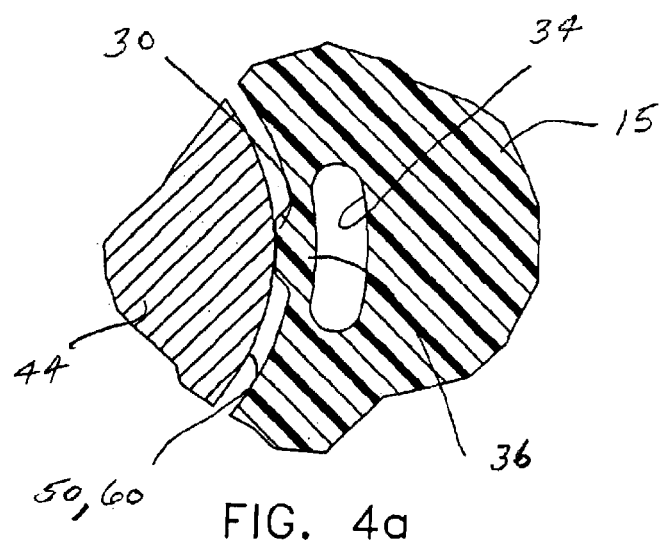
FIG. 4a is an enlarged view of a portion of FIG. 3.

Turning now to the drawings and particularly FIGS. 1 and 2 thereof, the heat sink assembly 10 of the present invention is shown including a heat sink 12, a clip 14 for the receipt thereof and a microprocessor 24 including a pin array and adapted to interconnect with the clip.

As previously indicated, the clip 12 may be of any conventional geometric configuration and is formed of an electrically insulative material such as ABS plastic and the clip includes a body 15 including an upper wall 16 and at least a pair of downwardly extending legs 18 which include inwardly extending fingers 20 for the receipt of the microprocessor 24 received in the pockets 22 formed thereby. As is known in the art, the microprocessor is simply slid into the pocket formed by the legs 18 and, accordingly, is positioned beneath an opening in the top wall 16 of the clip.

Such opening 26 is of a configuration to match that of the downwardly extending boss or base of the heat sink. Such base is depicted as circular for illustrative purposes but may be, as previously indicated, of other shapes as well. The inner edge of the opening 26 is provided with a plurality of inwardly extending flexible radiused contact surfaces or pressure cams 30 that, as will hereinafter be more fully apparent, are adapted to receive the uniquely configured heat sink base to accomplish the objects of the present invention. Adjacent the pressure cams and spaced radially outwardly from the edge of the opening are secondary openings 34 that serve to reduce the thickness of the supporting web 36 from which the pressure cams extend and to afford a level of outward flexibility to the cams as the heat sink base is forced into operational contact with the clip.

The heat sink is of overall conventional design in that the heat sink has a body generally with a plurality of vertically separated flanges or tiers 42. Downwardly extending from the body 40 is a connection base 44 having a lower heat transfer surface 46 that is adapted to contact the upper surface of the microprocessor for the purposes of transferring heat from the microprocessor to the heat sink in the intended manner.

The novel feature of the present invention is the provision of a heat sink base configured such that the base of the heat sink is provided with an inversely tapered working surface 50 such that the pressure cams are positioned in contact with such surface and enable the heat sink to move vertically back and within limits and dependent upon the heat conditions in the use atmosphere. More specifically, the heat sink base includes an initial lower conventionally tapered surface 52 adjacent the heat transfer surface 46 that is connected to the working surface along a connecting flange or connection edge 54 which defines the longest or largest circumferential portion of the base assuming a circular configuration above such edge 54. The working surface 50 extends above such inversely tapered edge 54 and thus forms an inclined plane 60 against which the pressure cams 30 of the clip are seated and, because of the relative dimensioning of these two contacting components, continuously apply a pressure on such inclined surface. The pressure applied by the cams will, of course, be primarily horizontally inward as shown by the direction of the arrows in FIGS. 5 and 5a. That pressure or force, in turn, places a downward force component on the heat sink to continually urge the heat sink and, accordingly, the heat transfer surface into contact with the upper surface of the microprocessor.

Figure 5A:
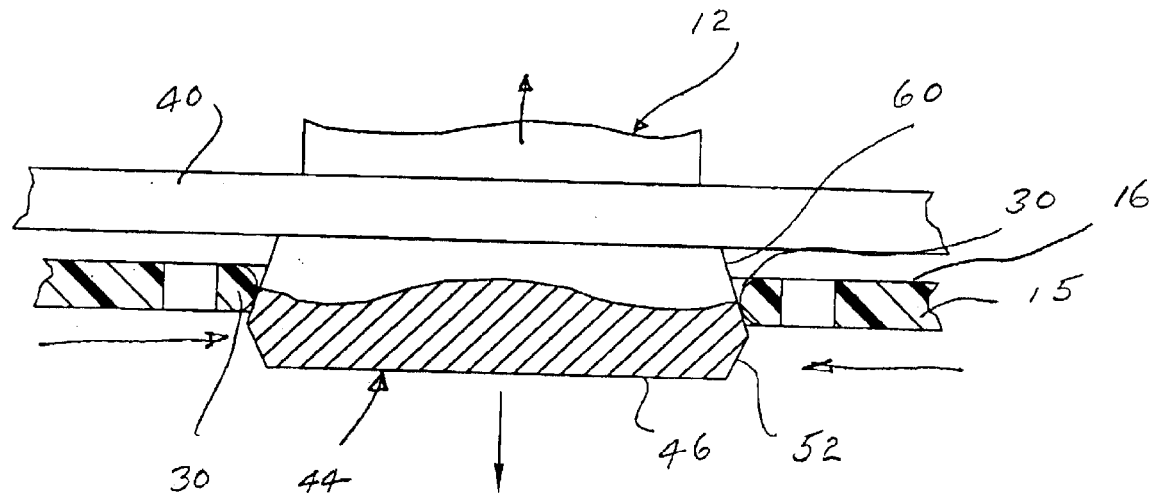
FIG. 5a is a view similar to FIG. 5 except showing how the heat sink may rise upwardly vis-à-vis the clip and microprocessor assembly as through expansion and thus illustrating an important feature of the present invention.
Figure 5:
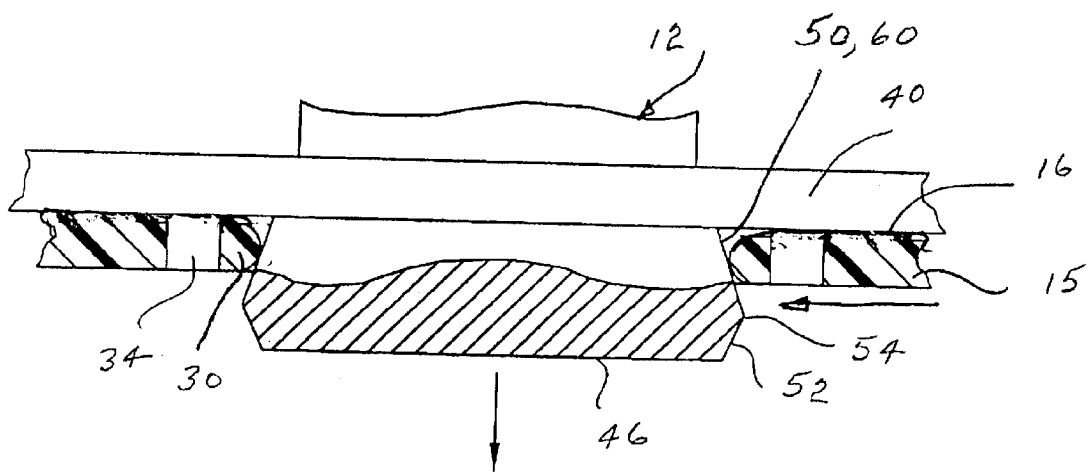
FIG. 5 is an enlarged cross-sectional view showing the details of how the clip and heat sink base interact with each other.

As shown in FIG. 5a during initial utilization of such a device under relatively low temperature conditions, the clip upper surface and the lower surface of the heat sink base are in contact with each other, but as the working temperature rises, the transistor and the connecting surfaces and components expand so as to apply a pressure on the bottom surface of the heat sink thus forcing the heat sink upwardly to accommodate such expansion yet still enable the heat transfer surfaces to be in contact with each other by reason of the continual downward pressure provided by the pressure cams. It should be pointed out as aforementioned that the shape of the heat sink can be modified so as to be square, triangular, etc. as long as the necessary modifications are made to coordinate that shape with the shape of the receiving hole in the clip.

While there is shown and described herein certain specific structure embodying this invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A heat sink assembly adapted for attachment to an electronic component having an upper surface so as to dissipate heat generated from the electronic component comprising a heat sink and a clip, said clip having an upper wall and attachment means in turn for engaging portions of the electronic component for attachment thereto whereby said upper wall is spaced from the heat generating surface of the electronic component, said upper wall including an opening defined by a peripheral surface which in turn forms a collar, said heat sink including a lower base and an upper heat dissipating body, said base having a lower heat transfer surface adapted for contact with the upper surface of the electronic component and a reverse tapered working surface adapted to connectively contact said collar whereby said base and said heat sink may vertically move upwardly and downwardly with respect to said clip as the temperature of the electronic component is raised or lowered respectively.

2. The heat sink assembly of claim 1 wherein said heat sink base working surface is adapted to slide upwardly and downwardly while maintaining frictional contact with said collar.

3. The heat sink assembly of claim 2, wherein said heat sink base includes a connecting flange in turn defining a connection edge of a peripheral extent larger than said collar and wherein said connection edge is positioned above said lower heat transfer surface and said working surface.

4. The heat sink assembly of claim 3, wherein said base and said collar are both of circular configuration.

5. The heat sink assembly of claim 2, wherein said collar includes peripherally spaced outwardly flexible pressure cams in turn adapted for contact with said working surface.

6. The heat sink assembly of claim 5, each of said pressure cams in part defined by a secondary opening positioned radially outwardly from said opening defining peripheral surface so as to define an outwardly flexible supporting material web, said webs forming said cams.

7. The heat sink assembly of claim 2, wherein an upwardly outwardly tapered lower surface is positioned between said lower heat transfer surface and said working surface and wherein said tapered lower surface and said working surface connect along and cooperatively define said connection edge.

8. The heat sink assembly of claim 1, wherein said clip attachment means comprising downwardly extending flanges having an inwardly extending finger in turn adapted to extend beneath portions of the electronic component.

* * * * *